(12) United States Patent
Dando et al.

(10) Patent No.: US 7,000,636 B2
(45) Date of Patent: Feb. 21, 2006

(54) VALVE ASSEMBLIES FOR USE WITH A REACTIVE PRECURSOR IN SEMICONDUCTOR PROCESSING

(75) Inventors: Ross S. Dando, Nampa, ID (US); Gurtej S. Sandhu, Boise, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 10/691,769

(22) Filed: Oct. 22, 2003

(65) Prior Publication Data

US 2004/0084147 A1 May 6, 2004

Related U.S. Application Data

(62) Division of application No. 10/107,609, filed on Mar. 26, 2002, now Pat. No. 6,800,134.

(51) Int. Cl.
F16K 11/085 (2006.01)

(52) U.S. Cl. .................................. 137/625.46; 118/900
(58) Field of Classification Search ................. 251/118; 137/625.46; 118/900
See application file for complete search history.

(56) References Cited

U.S. PATENT DOCUMENTS

| 1,207,769 | A | | 12/1916 | Kenney ................. 137/625.23 |
| 2,827,924 | A | * | 3/1958 | Towler et al. .......... 137/625.11 |
| 3,212,527 | A | | 10/1965 | Hall et al. .............. 137/625.43 |
| 4,156,437 | A | * | 5/1979 | Chivens et al. ............. 137/554 |
| 4,723,967 | A | * | 2/1988 | Tom ............................... 95/90 |
| 4,738,265 | A | | 4/1988 | Ritchart et al. ............. 600/486 |
| 5,000,225 | A | * | 3/1991 | Murdoch ................ 137/625.46 |
| 5,172,725 | A | | 12/1992 | Kitagawa ................ 137/625.43 |
| 5,396,082 | A | | 3/1995 | Wada et al. .................... 257/13 |
| 6,135,152 | A | * | 10/2000 | Knapp .................... 137/625.41 |
| 6,511,539 | B1 | | 1/2003 | Raaijmakers ................ 117/102 |
| 6,534,395 | B1 | | 3/2003 | Werkhoven et al. ......... 438/627 |
| 6,616,986 | B1 | | 9/2003 | Sherman ...................... 427/562 |
| 6,617,173 | B1 | | 9/2003 | Sneh ............................... 438/3 |
| 2002/0028290 | A1 | | 3/2002 | Cook et al. ............ 427/255.28 |
| 2002/0031618 | A1 | | 3/2002 | Sherman ...................... 427/569 |
| 2003/0049372 | A1 | | 3/2003 | Cook et al. .............. 427/248.1 |
| 2003/0134038 | A1 | | 7/2003 | Paranjpe .................. 427/248.1 |

FOREIGN PATENT DOCUMENTS

| EP | 0505251 A2 | 9/1992 |
| EP | 0559326 A1 | 9/1993 |
| EP | 0683249 A1 | 11/1995 |

* cited by examiner

*Primary Examiner*—John Fox
(74) *Attorney, Agent, or Firm*—Wells St. John P.S.

(57) ABSTRACT

The invention includes chemical vapor deposition methods, including atomic layer deposition, and valve assemblies for use with a reactive precursor in semiconductor processing. In one implementation, a chemical vapor deposition method includes positioning a semiconductor substrate within a chemical vapor deposition chamber. A first deposition precursor is fed to a remote plasma generation chamber positioned upstream of the deposition chamber, and a plasma is generated therefrom within the remote chamber and effective to form a first active deposition precursor species. The first species is flowed to the deposition chamber. During the flowing, flow of at least some of the first species is diverted from entering the deposition chamber while feeding and maintaining plasma generation of the first deposition precursor within the remote chamber. At some point, diverting is ceased while feeding and maintaining plasma generation of the first deposition precursor within the remote chamber. Other aspects and implementations are contemplated.

26 Claims, 5 Drawing Sheets

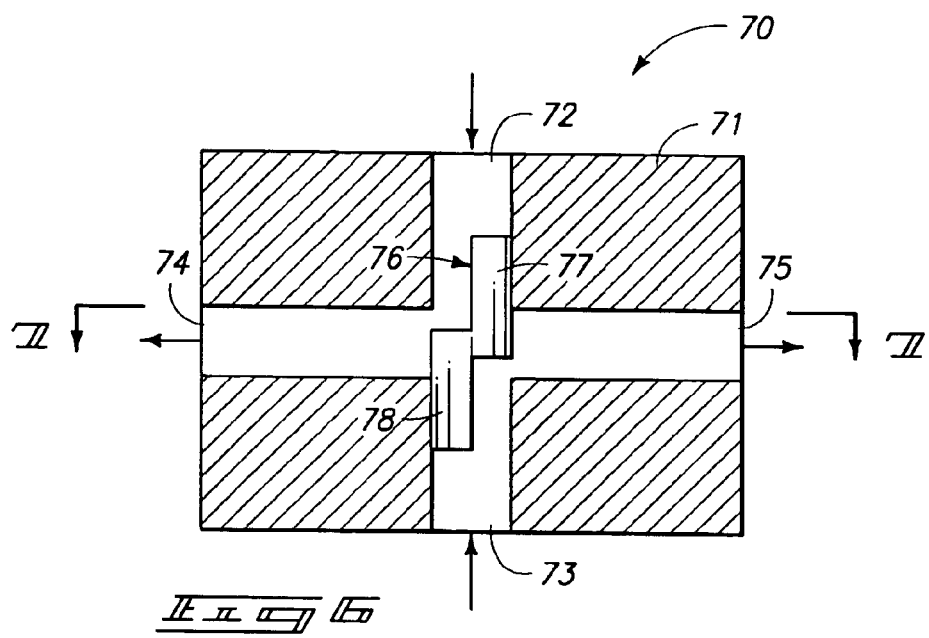
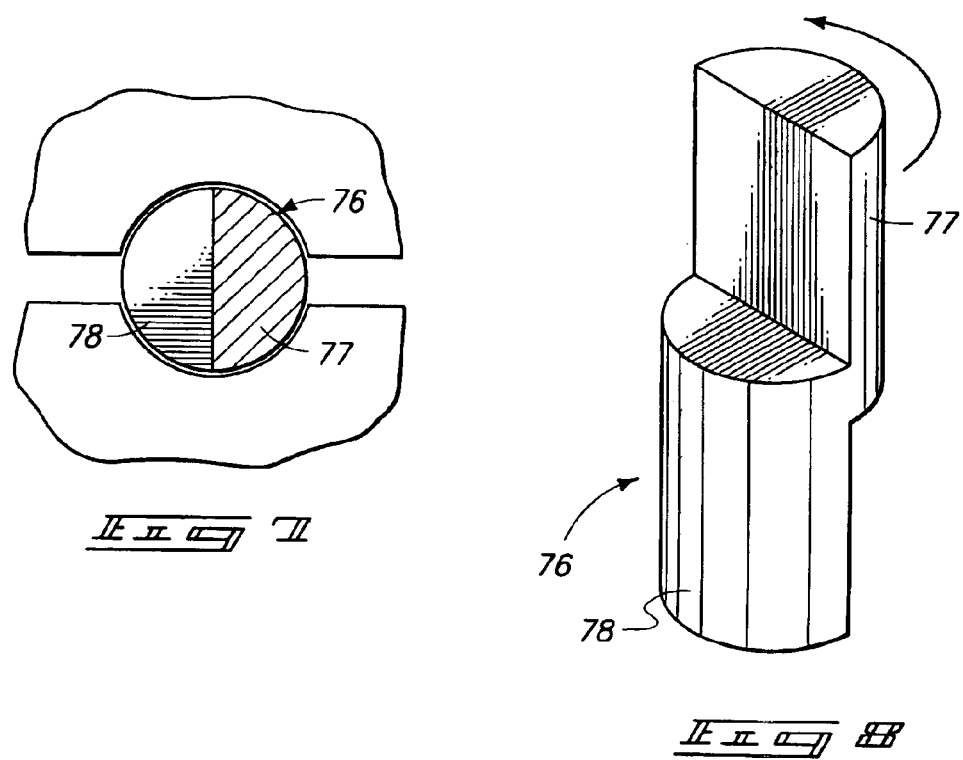

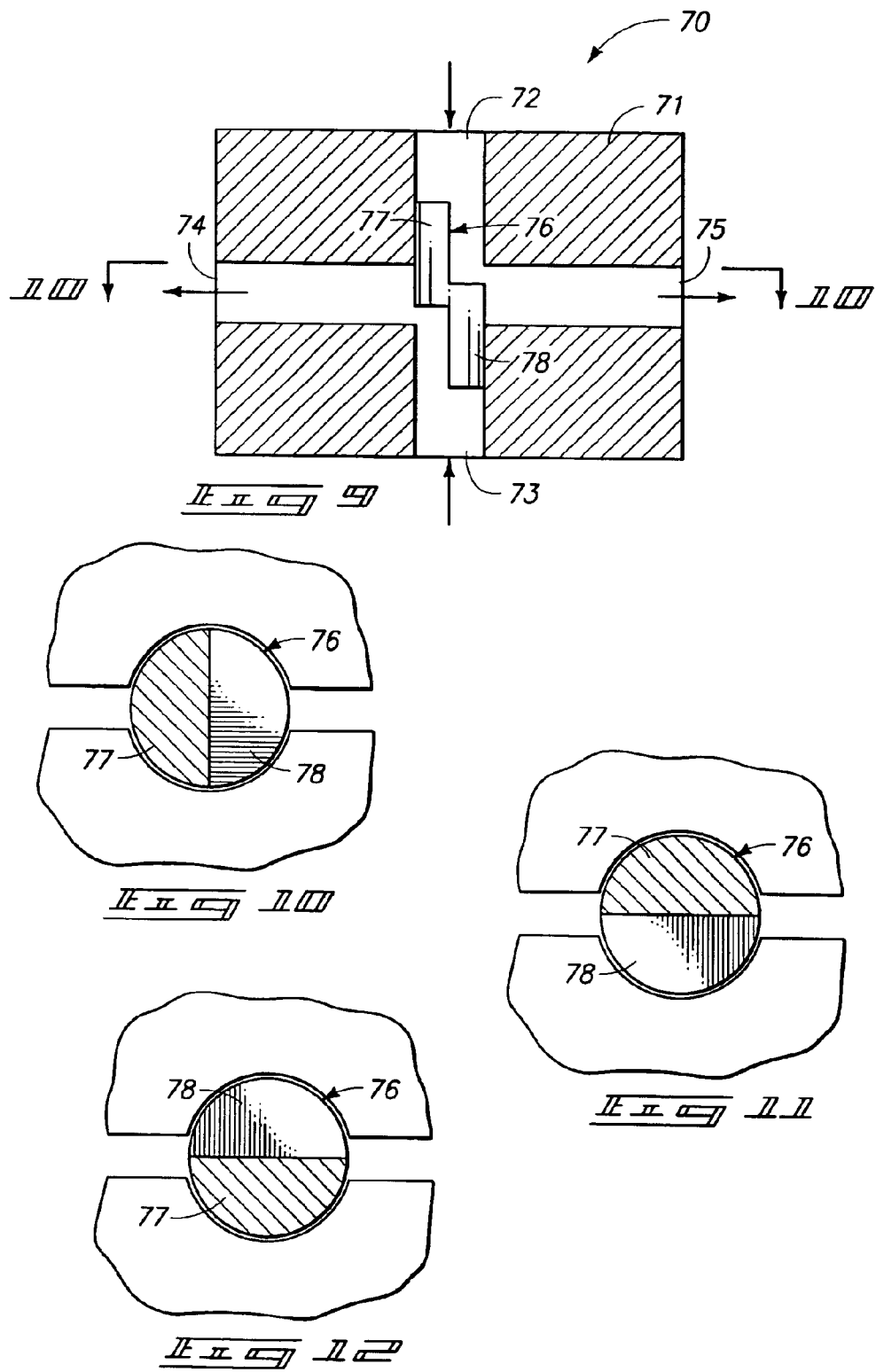

VALVE ASSEMBLIES FOR USE WITH A REACTIVE PRECURSOR IN SEMICONDUCTOR PROCESSING

RELATED PATENT DATA

This patent resulted from a divisional application of U.S. patent application Ser. No. 10/107,609, filed Mar. 26, 2002 now U.S. Pat. No. 6,800,134, entitled "Chemical Vapor Deposition Methods and Atomic Layer Deposition Methods", naming Ross S. Dando, Gurtej S. Sandhu and Allen P. Mardian as inventors, the disclosure of which is incorporated by reference.

TECHNICAL FIELD

This invention relates to chemical vapor deposition methods, including atomic layer deposition, and to valve assemblies for use with a reactive precursor in semiconductor processing.

BACKGROUND OF THE INVENTION

Semiconductor processing in the fabrication of integrated circuitry typically includes the deposition of layers on semiconductor substrates. Exemplary processes include physical vapor deposition (PVD) and chemical vapor deposition (CVD). In the context of this document, "CVD" includes any process, whether existing or yet-to-be developed, where one or more vaporized chemicals is fed as a deposition precursor for reaction and adherence to a substrate surface. By way of example only, one such CVD process includes atomic layer deposition (ALD). With typical ALD, successive mono-atomic layers are adsorbed to a substrate and/or reacted with the outer layer on the substrate, typically by successive feeding of different precursors to the substrate surface.

Chemical vapor depositions can be conducted within chambers or reactors which retain a single substrate upon a wafer holder or susceptor. One or more precursor gasses are typically provided to a shower head within the chamber which is intended to uniformly provide the reactant gasses substantially homogeneously over the outer surface of the substrate. The precursors react or otherwise manifest in a deposition of a suitable layer atop the substrate. Plasma enhancement may or may not be utilized, and either directly within the chamber or remotely therefrom.

In certain chemical vapor deposition processes, including ALD, precursors are pulsed or otherwise intermittently injected into the reactor for reaction and/or deposition onto a substrate. In many cases, it is highly desirable to turn the individual precursor flows on and off very quickly. For example, some deposition processes utilize plasma generation of a precursor in a chamber remote from the deposition chamber. As the precursor leaves the remote plasma generation chamber, such typically converts to a short lived, non-plasma desired active state intended to be maintained for reaction in the deposition chamber. Yet plasma generation in the remote chamber is very pressure dependent, and the plasma typically ceases in the remote chamber when switching/pulsing the active species flow to the chamber. Accordingly, such process are expected to utilize pulsed remote plasma generation, and which may not be practical.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes chemical vapor deposition methods, including atomic layer deposition, and valve assemblies for use with a reactive precursor in semiconductor processing. In one implementation, a chemical vapor deposition method includes positioning a semiconductor substrate within a chemical vapor deposition chamber. A first deposition precursor is fed to a remote plasma generation chamber positioned upstream of the deposition chamber, and a plasma is generated therefrom within the remote chamber and effective to form a first active deposition precursor species. The first species is flowed to the deposition chamber. During the flowing, flow of at least some of the first species is diverted from entering the deposition chamber while feeding and maintaining plasma generation of the first deposition precursor within the remote chamber. At some point, diverting is ceased while feeding and maintaining plasma generation of the first deposition precursor within the remote chamber.

In one implementation, a chemical vapor deposition method includes positioning a semiconductor substrate within a chemical vapor deposition chamber. A first deposition precursor is fed to the chamber through at least a portion of a rotatable cylindrical mass of a valve assembly. During the flowing, flow of at least some of the first deposition precursor is diverted from entering the deposition chamber by rotating the cylindrical mass in a first rotational direction. At some point while diverting is occurring, the cylindrical mass is rotated in the first rotational direction effective to cease said diverting.

In one implementation, a valve assembly for a reactive precursor to be used in semiconductor processing includes a valve body having at least one inlet and at least two outlets. The inlet is configured for connection with a reactive precursor source. A first of the outlets is configured for connection with a feed stream to a semiconductor substrate processor chamber. A second of the outlets is configured for diverting precursor flow away from said chamber. The valve body includes a first fluid passageway therein extending between the inlet and the first outlet. The valve body has a second fluid passageway extending between the first fluid passageway and the second outlet. A control plate and/or generally cylindrical mass is mounted for at least limited rotation within the body proximate the first and second passageways. Such includes an arcuate region at least a portion of which is received within the first passageway. The arcuate region includes a first region having an opening extending therethrough and which is positionable into a first selected radial orientation to provide the inlet and the first outlet in fluid communication with one another through the first passageway while restricting flow to the second passageway. The arcuate region includes a second region positionable into the first radial orientation to provide the inlet and second outlet in fluid communication through the first and second passageways while restricting flow to the first outlet.

Other aspects and implementations are contemplated.

BRIEF DESCRIPTION OF THE DRAWINGS

Preferred embodiments of the invention are described below with reference to the following accompanying drawings.

FIG. 6 is a diagrammatic sectional view taken of an alternate embodiment valve assembly in accordance with an aspect of the invention, and in one operational orientation.

FIG. 7 is an enlarged sectional view taken through line 7—7 in FIG. 6.

FIG. 8 is an enlarged perspective view of a component of the FIG. 6 valve assembly.

FIG. 9 is a diagrammatic sectional view of the FIG. 6 valve assembly in another operational orientation.

FIG. 10 is an enlarged sectional view taken through line 10—10 in FIG. 9.

FIG. 11 is an enlarged diagrammatic sectional view of the FIG. 6 valve assembly in yet another operational orientation.

FIG. 12 is an enlarged diagrammatic sectional view of the FIG. 6 valve assembly in still another operational orientation.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
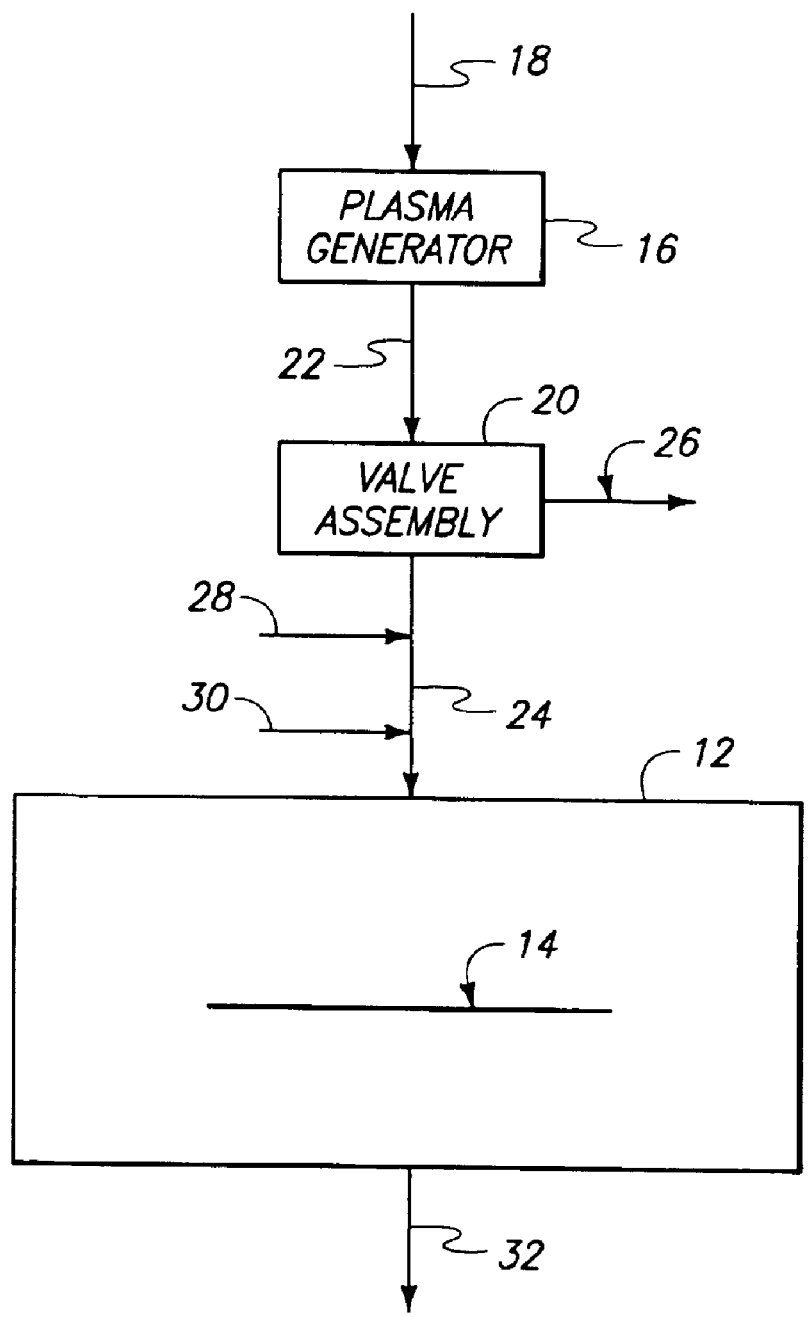
FIG. 1 is a diagrammatic illustration of a preferred embodiment implementation of an aspect of the invention.

A first embodiment chemical vapor deposition method is described initially with reference to FIG. 1. Such depicts a chemical vapor deposition chamber 12 having a semiconductor substrate 14 positioned therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A remote plasma generation chamber 16 is positioned upstream of deposition chamber 12. Any existing or yet-to-be-developed remote plasma generation is contemplated. Plasma generator 16 is fed by an inlet stream 18 for feeding some suitable first deposition precursor thereto. A valve assembly 20 is depicted as being received intermediate plasma generator 16 and deposition chamber 12. An out-feed line 22 from plasma generator 16 is depicted as being an in-feed line to valve assembly 20. An out-feed line 24 feeds from valve assembly 24 to deposition chamber 12, and another out-feed line 26 from valve assembly 20 is directed away from feeding to deposition chamber 12. More than the illustrated valve assembly input and outputs are of course contemplated.

Valve assembly out-feed line 24 includes exemplary additional in-feed lines 28 and 30. Such might be configured for providing additional deposition precursors and/or purge gasses for separate or combined flow with precursor from valve assembly 20 to deposition chamber 12. More or fewer downstream lines could be included, of course, as well as being directly provided to chamber 12 apart from stream 24.

The above-described and illustrated embodiment of FIG. 1 is but one example diagrammatic depiction usable in carrying out methodical aspects of the invention. Any other processing in accordance with the method claims as literally worded without limiting or interpretative reference to the specification or drawings is also of course contemplated.

With semiconductor substrate 14 positioned within deposition chamber 12, a first deposition precursor is fed to remote plasma generation chamber 16. A plasma is generated therefrom within the remote chamber effectively to form a first active deposition precursor species for provision to deposition chamber 12. Such first species is flowed to deposition chamber 12 via line 22, valve assembly 20 and line 24. During such flowing, the flow of at least some of the first species is diverted from entering deposition chamber 12, all while feeding and maintaining plasma generation of the first deposition precursor within the remote chamber. For example in the preferred embodiment, valve assembly 20 is operated for diverting the flow of at least some of the first species into line 26 as opposed to line 24. In the depicted preferred embodiment, diverting and ceasing thereof is controlled by a single valve assembly 20 located downstream of remote chamber 16 and upstream of deposition chamber 12 as respects flow of the first deposition precursor.

In one preferred embodiment, the diverting is effective to divert substantially all of the first species from entering the deposition chamber, and all while feeding and maintaining plasma generation of the first deposition precursor within the remote chamber. In other words in the depicted preferred embodiment, line 24 is effectively completely blocked off by valve assembly 20, with line 26 being provided in an open state by valve assembly 20.

In one preferred embodiment, the method is atomic layer deposition, with chamber 12 comprising an atomic layer deposition chamber. Flowing of the first species to chamber 12 and substrate 14 therein is thereby effective to form a first monolayer on the substrate. In one preferred atomic layer deposition while such diverting is occurring, for example into line 26, a purge gas is flowed to chamber 12, and all while feeding and maintaining plasma generation of the first deposition precursor within the remote chamber. For example in the FIG. 1 depicted embodiment, a purge gas could be flowed to chamber 12 via one or both of lines 28 and 30. Further in one preferred atomic layer deposition method in accordance with an aspect of the invention, after flowing the purge gas and while diverting, a second deposition precursor different from the first deposition precursor is fed to deposition chamber 12 effective to form a second monolayer on the first monolayer, and all while feeding and maintaining plasma generation of the first deposition precursor within remote chamber 16. Again in the depicted exemplary embodiment, one or both of lines 28 and 30 could be utilized for the same. Further in accordance with one preferred atomic layer deposition method implementation, after forming the second monolayer and while diverting, a purge gas (the same or different from the first-described purge gas) is flowed to the chamber all while feeding and maintaining plasma generation of the first deposition precursor within remote chamber 16.

Regardless, a chemical vapor deposition method in accordance with an aspect of the invention contemplates ceasing the diverting all while feeding and maintaining plasma generation of the first deposition precursor within the remote chamber. In one embodiment where the diverting constitutes ceasing essentially all flow of the first species from entering the deposition chamber, such ceasing of the diverting will result in the resumption of first species flow to chamber 12.

In one embodiment where such diverting does not constitute diversion of all of the first species from entering the deposition chamber, such ceasing of the diverting will result in an increased rate of flow of the first species to chamber 12.

In one atomio layer deposition method in accordance with an aspect of the invention, another monolayer is effectively formed on the substrate. Such monolayer may be the same as the first monolayer. Such monolayer may be a third monolayer formed on the second monolayer, which is the same as either the first or second monolayers, or some reaction product thereof.

In one considered aspect, the flowing of the first species to deposition chamber 12 can be considered as being at subatmospheric pressure, and comprises flow into a first passageway inlet, for example the inlet to line 24 exiting valve assembly 20. The diverting can be considered as comprising flow into a second passageway inlet, for example into line 26 from valve assembly 20. In accordance with one aspect of the invention, the method comprises maintaining pressure of the first inlet and the second inlet within 500 mTorr, and more preferably within 100 mTorr, from one another during the flowing and the diverting. By way of example only, maintaining such pressure control during the entirety of the deposition process can facilitate maintenance and control of plasma within remote generator 16. Yet in one preferred embodiment, the invention contemplates keeping the pressure of the first inlet and the second inlet greater than 500 mTorr from one another during the flowing and the diverting. Subatmospheric pressure within the exemplary system, as well as within plasma generator 16, is intended to be maintained in the preferred embodiment primarily by line 26 and an out-feed line 32 from chamber 12 to the same or different subatmospheric vacuum pressure sources.

In one exemplary preferred embodiment, particularly where the diverting is of all flow from entering line 24, the diverting preferably takes place over a time period sufficient to reduce the risk of temporarily isolating vacuum pressure from plasma generator 16, which might otherwise cause extinguishing of the plasma. In one preferred embodiment, the diverting takes from 0.1 second to 1.0 second from staring the diverting of the first species to total diversion of the first species, and in another embodiment takes more than 1.0 second.

In one preferred embodiment, the diverting, for example utilizing valve assembly 20, comprises rotating a cylindrical valve mass. In one preferred embodiment, the diverting, for example utilizing valve assembly 20, comprises rotating a valve plate which may or may not constitute a cylindrical valve mass. For example, and by way of example only, such a valve plate might be square or rectangular in cross-section, as opposed to being substantially round in at least one cross-section.

In one exemplary implementation, the diverting, for example using valve assembly 20, can comprise pivoting a valve flap, and in one exemplary implementation can comprise straight linearly sliding of a diverting valve mass.

By way of example only, two exemplary valve assembly constructions usable in carrying out methodical aspects of the invention are described with reference to FIGS. 2–12. The invention also contemplates valve assemblies for use in semiconductor processing with reactive precursors independent of any method claimed or described herein. The respective method claim families and apparatus claim families stand as literally worded, without reference to the other. In other words, the concluding apparatus claims are not limited by the method claims, nor are the concluding method claims limited by any attribute of the apparatus claims, unless literal language appears in such claims, and without any limiting or interpretative reference to the specification or drawings.

Figure 2:
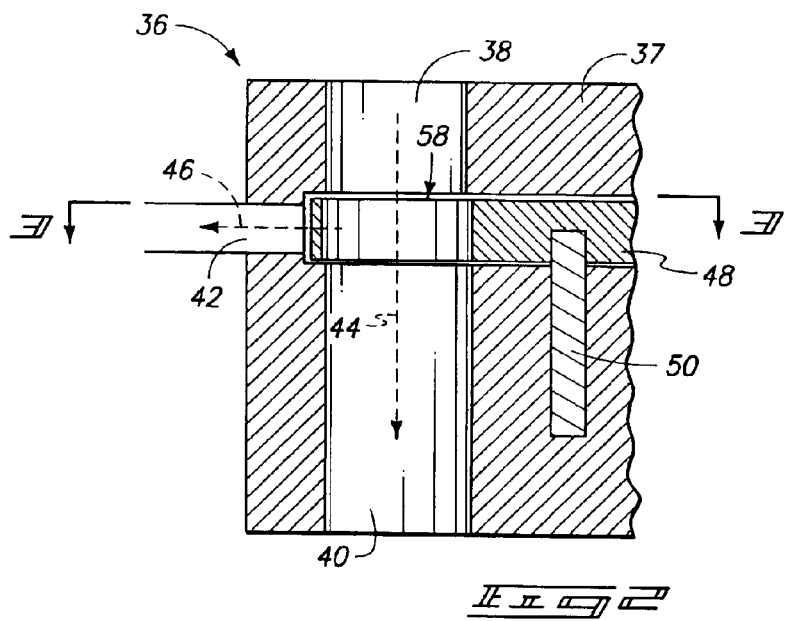
FIG. 2 is a diagrammatic sectional view taken through line 2—2 in FIG. 3 of a valve assembly in accordance with an aspect of the invention, and in one operational orientation.
Figure 3:
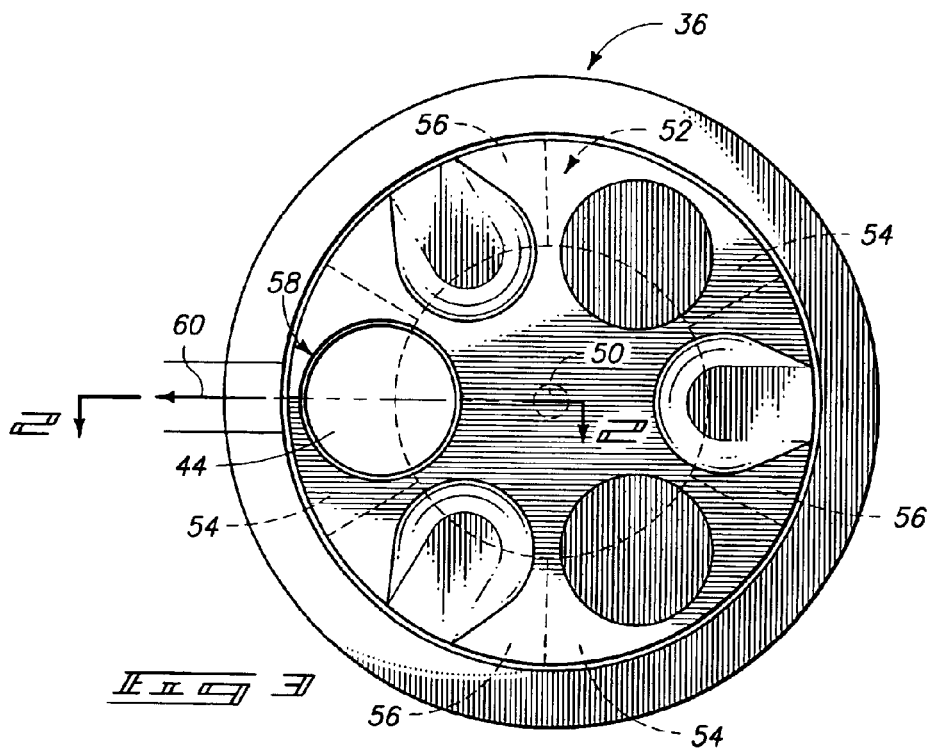
FIG. 3 is a sectional view taken through line 3—3 in FIG. 2.
Figure 4:
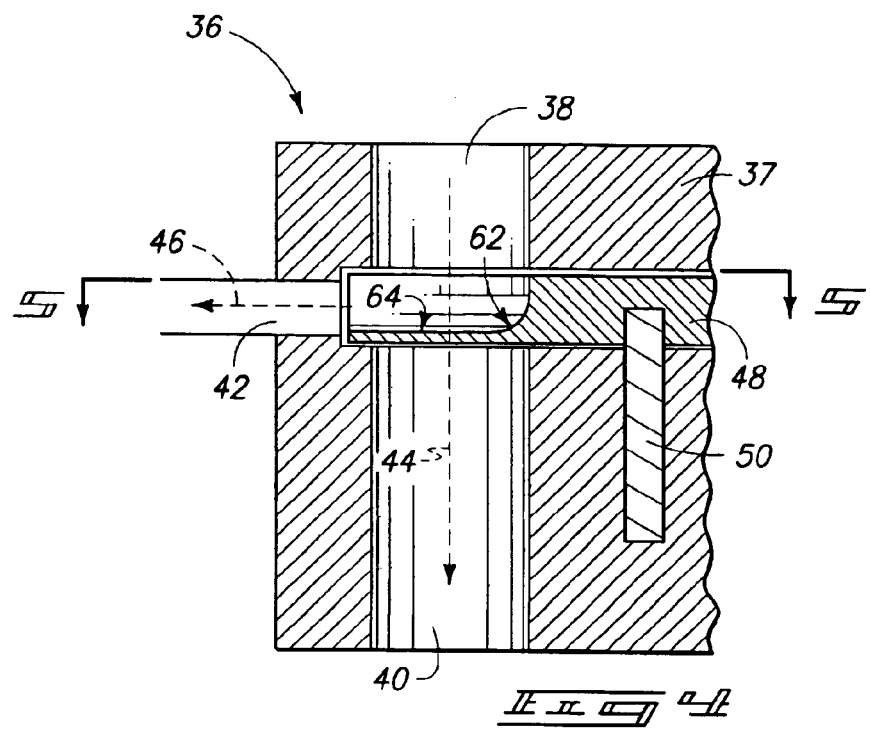
FIG. 4 is a sectional view taken through line 4—4 in FIG. 5, and is of the FIG. 2 valve assembly in another operational orientation.
Figure 5:
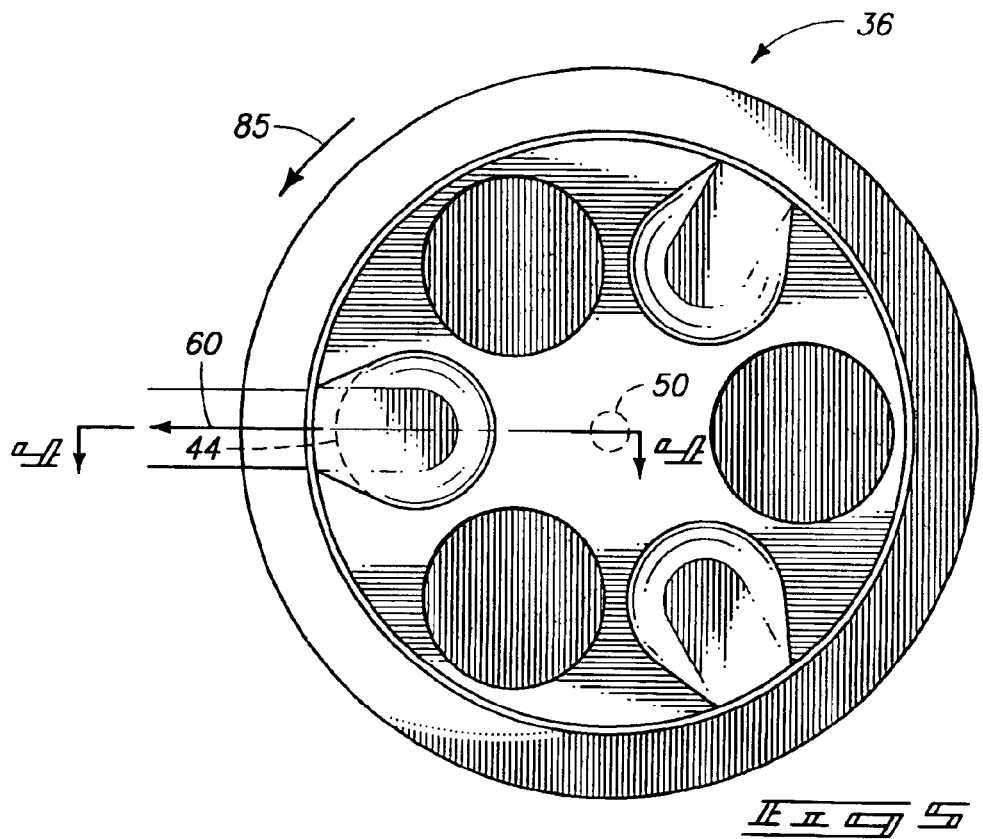
FIG. 5 is a sectional view taken through line 5—5 in FIG. 4.

An exemplary first embodiment semiconductor processing reactive precursor valve assembly is described with reference to FIGS. 2–5, and is indicated generally with reference numeral 36. FIGS. 2 and 3 depict assembly 36 in one exemplary operational configuration, while FIGS. 4 and 5 depict assembly 36 in another operational configuration. Valve assembly 36 comprises a valve body 37 having at least one inlet 38 and at least two outlets 40 and 42. Inlet 38 is configured for connection with a reactive precursor source. First depicted outlet 40 is configured for connection with a feed stream to a semiconductor substrate processor chamber, and second outlet 42 is configured for diverting precursor flow away from such chamber. Valve body 37 comprises a first fluid passageway 44 therein extending between inlet 38 and first outlet 40. Valve body 37 also comprises a second fluid passageway 46 extending between first fluid passageway 44 and second outlet 42. In the depicted preferred embodiment, first passageway 44 extends in a straight axial line through valve body 37 from inlet 38 to outlet 40, and second passageway 46 extends in a straight axial line through valve body 37 perpendicular to and from first passageway 44 to second outlet 42. Either might be of any constant or variable cross sectional shape, and/or size.

A control mass 48 is mounted for at least limited rotation within body 37 proximate the first and second passageways. In one implementation, control mass 48 is in the form of a control plate. In one implementation, control mass 48 is in the form of a generally cylindrical mass. In the depicted preferred embodiment, control mass 48 is in the form of both a control plate which is round and in the form of a generally cylindrical mass. The depicted embodiment shows control plate 48 mounted for rotation about a central axis 50 constituting a rod within body 37 which projects into control plate 48 for rotational support. Accordingly and further in a preferred embodiment, the axis of rotation 50 is oriented generally parallel with respect to first axial straight line 44, and accordingly with respect to a direction of precursor flow proximate the valve plate. Valve/control plate 48 is also in the preferred embodiment mounted for 360° of rotation within body 37.

Control plate/cylindrical mass 48 includes an arcuate region 52 (FIG. 3), at least a portion of which is received within first passageway 44. Arcuate region 52 includes a first region 54 having an opening 58 extending through the plate and positionable into a first selected radial orientation 60 (as shown in FIGS. 2 and 3) to provide inlet 38 and first outlet 40 in fluid communication with one another through first passageway 44 while restricting flow to second passageway 46. In the preferred depicted embodiment, first region 54 is configured to block all fluid flow from entering second fluid passageway 46 when in first selected radial orientation 60. Further in the preferred embodiment, opening 58 has a maximum cross-section which is at least as large of that of first passageway 44 proximate control plate 48. Further in the preferred embodiment, opening 58 has a cross sectional shape which is the same as that of that of first passageway 44 proximate control plate 48 (i.e., circular). Alternately, the opening could have a cross sectional shape which is different (i.e., any of elliptical, square, rectangular, triangular, s-shaped, circular, etc.) from that of the first passageway (i.e., any different of elliptical, square, rectangular, triangular, s-shaped, circular, etc.). Preferably in such instance, the opening has a maximum cross-section which is at least as large of that of the first passageway proximate the control plate.

Arcuate region 52 includes a second region 56 positionable into first radial orientation 60 (FIGS. 4 and 5) to provide inlet 38 and second outlet 42 in fluid communication with one another through first passageway 44 and second passageway 46 while restricting flow to first outlet 40. In the depicted preferred embodiment, second region 56 is configured to block substantially all fluid flow to first outlet 40 when in the first selected radial orientation 60. In the depicted preferred embodiment, second region 56 includes an arcuate surface 62 (FIG. 4) configured to direct fluid flow 90° from a flow direction to plate 48. A flat surface 64 is connected with arcuate surface 62 and extends to second passageway 46 when in first radial position 60 (FIGS. 4 and 5). In the depicted preferred embodiment, second region 56 does not include a hole extending through plate 48.

As shown, arcuate region 52 is in the form of an annulus, including a plurality of alternating first and second regions 54 and 56. At least three of the first regions and at least three of the second regions are included in one preferred embodiment.

Another exemplary embodiment semiconductor processing reactive precursor valve assembly 70 is depicted in various operational states in FIGS. 6–12. Assembly 70 includes a valve body 71 having at least first and second inlets 72, 73, and at least two outlets 74, 75. First and second inlets 72, 73 are configured for connection with distinct gas sources at least one of which is a deposition precursor. A first of the outlets, for example outlet 74, is configured for connection with a feed stream to a semiconductor substrate processor chamber. A second of the outlets, for example outlet 75, is configured for diverting gas flow away from such chamber. In the depicted preferred embodiment, first and second inlet 72, 73 to valve body 71 are opposed 180° from one another, as are first and second outlets 74, 75. Further, first and second inlets 72, 73 to valve body 71 are oriented at 90° from first and second outlets 74, 75 from body 71.

A generally cylindrical mass 76 is mounted for at least limited rotation within body 71. Such comprises a first longitudinal portion 77 and a second longitudinal portion. 78 proximate thereto (FIGS. 6 and 8). In the depicted preferred embodiment, the first and second longitudinal portions are substantially mirror images of one another, with generally cylindrical mass 76 comprising two overlapping half cylindrical-shaped sections.

First longitudinal portion 77 is configured to provide first inlet 72 in fluid communication with first outlet 74 when in a first selected radial orientation (i.e., that radial orientation depicted in FIGS. 6 and 7). First longitudinal portion 77 is also configured to provide first inlet 72 in fluid communication with second outlet 75 when in a second selected radial orientation (i.e., as shown in FIGS. 9 and 10).

Further, second longitudinal portion 78 is configured to provide second inlet 73 in fluid communication with first outlet 74 when in the second selected radial orientation (i.e., that of FIGS. 9 and 10). Second longitudinal portion 78 is also configured to provide second inlet 73 in fluid communication with second outlet 75 when in the first selected radial orientation (i.e., FIGS. 6 and 7).

FIGS. 11 and 12 diagrammatically illustrate respective third and fourth selected radial orientations. As shown in the exemplary third radial orientation (FIG. 11), first longitudinal portion 77 is configured to provide first inlet 72 in fluid communication with both first and second outlets 74, 75. Further, second longitudinal portion 78 is configured to provide second inlet 73 in fluid communication with both first and second outlets 74, 75 in the third selected radial orientation. The same relationships exist in the FIG. 12 fourth selected radial orientation, which is 180° from the third selected radial orientation.

The above-described structures are, of course, usable with or without remote plasma generation. Further, the rotational speed, size, shape and placement of the respective inlet and outlet openings can be used to determine the duty cycle and pulse length of the various gas on/off states in the various embodiments.

Additional methods are contemplated in accordance with aspects of the invention. In one implementation, an atomic layer deposition method includes positioning a semiconductor substrate within an atomic layer deposition chamber. A first deposition precursor is fed to a remote plasma generation chamber positioned upstream of the deposition chamber and a plasma is generated therefrom within the remote chamber and effective to form a first active deposition precursor species. The first species is flowed to the substrate through at least a portion of a rotatable cylindrical mass of a valve assembly effective to form a first monolayer on the substrate.

During the flowing, the flow of substantially all the first species is diverted from entering the deposition chamber with the rotatable cylindrical mass, while feeding and maintaining plasma generation of the first deposition precursor within the remote chamber. While diverting, a purge gas is flowed to the chamber through at least a portion of the rotatable cylindrical mass of the valve assembly while feeding and maintaining plasma generation of the first deposition precursor within the remote chamber. After flowing the purge gas, the cylindrical mass is rotated effective to cease such diverting while feeding and maintaining plasma generation of the first deposition precursor within the chamber, and ultimately, effective to form another monolayer on the substrate. An intervening monolayer may or may not be formed. In one implementation, the portion through the rotatable cylindrical mass of the valve assembly through which the first species flows is different from the portion through the rotatable cylindrical mass of the valve assembly through which the purge gas flows (for example, and by way of example only, using the structure of FIGS. 2–5).

In yet another considered aspect of the invention, a chemical vapor deposition method is contemplated regardless of remote plasma generation. In accordance with this aspect of the invention, a semiconductor substrate is positioned within a chemical vapor deposition chamber. A first deposition precursor is fed to the chamber through at least a portion of a rotatable cylindrical mass of a valve assembly. During the flowing, the flow of at least some of the first deposition precursor is diverted from entering the deposition chamber by rotating the cylindrical mass in a first rotational direction (i.e., rotational direction 85 as shown in FIG. 5 if using such apparatus). During the diverting, the cylindrical mass is rotated in the first rotational direction effective to cease such diverting (i.e., to place the FIGS. 2–5 embodiment in the position depicted by FIGS. 2 and 3 if using such apparatus). Atomic layer deposition and remote plasma generation within a chamber remote from the deposition chamber are also, of course, contemplated.

Regardless and in one preferred embodiment, rotation of the rotatable cylindrical mass in the first rotational direction is maintained from the feeding to the diverting to the ceasing of such diverting. Such maintaining might be at a variable rate of rotation in the first rotational direction among the feeding to the diverting to the ceasing of said diverting, or might be at a constant rate of rotation. Further and regardless, the invention contemplates in one aspect continuing such rotation in the first direction after ceasing effective to start said feeding again.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing reactive precursor valve assembly comprising:
   a valve body having at least one inlet and at least two outlets, the inlet being configured for connection with a reactive precursor source, a first of the outlets being configured for connection with a feed stream to a semiconductor substrate processor chamber, a second of the outlets being configured for diverting precursor flow away from said chamber;
   the valve body comprising a first fluid passageway therein extending between the inlet and the first outlet, the valve body comprising a second fluid passageway extending between the first fluid passageway and the second outlet; and
   a control plate mounted for at least limited rotation within the body proximate the first and second passageways, the plate including an arcuate region at least a portion of which is received within the first passageway, the arcuate region including a first region having an opening extending through the plate positionable into a first selected radial orientation to provide the inlet and the first outlet in fluid communication with one another through the first passageway while restricting flow to the second passageway, the arcuate region including a second region positionable into the first radial orientation to provide the inlet and second outlet in fluid communication through the first and second passageways while restricting flow to the first outlet.

2. The assembly of claim 1 wherein the first passageway extends in a straight axial line through the valve body from the inlet to the first outlet.

3. The assembly of claim 1 wherein the second passageway extends in a straight axial line through the valve body from the first passageway to the second outlet.

4. The assembly of claim 1 wherein,
   the first passageway extends in a first straight axial line through the valve body from the inlet to the first outlet; and
   the second passageway extends in a second straight axial line through the valve body from the first passageway to the second outlet.

5. The assembly of claim 4 wherein the first and second axial lines are perpendicular to one another.

6. The assembly of claim 1 wherein the control plate is circular.

7. The assembly of claim 1 wherein the control plate is mounted for 360° rotation within the body.

8. The assembly of claim 1 wherein the arcuate region is an annulus including a plurality of alternating of said first and second regions.

9. The assembly of claim 1 wherein,
   the control plate is mounted for 360° rotation within the body; and
   the arcuate region is an annulus including a plurality of alternating of said first and second regions.

10. The assembly of claim 9 comprising at least three of said first regions and at least three of said second regions.

11. The assembly of claim 1 wherein the first region is configured to block substantially all fluid flow to the second passageway when in the first selected radial orientation.

12. The assembly of claim 1 wherein the second region is configured to block substantially all fluid flow to the first outlet when in the second selected radial orientation.

13. The assembly of claim 1 wherein the first region plate opening has a maximum cross section which is at least as large as that of the first passageway proximate the control plate.

14. The assembly of claim 1 wherein the first region plate opening has a cross sectional shape which is the same as that of the first passageway proximate the control plate.

15. The assembly of claim 1 wherein the first region plate opening has a cross sectional shape which is different from that of the first passageway proximate the control plate.

16. The assembly of claim 1 wherein the first passageway extends in a straight axial line through the valve body from the inlet to the first outlet, the control plate being mounted for rotation about an axis which is generally parallel with the straight axial line.

17. The assembly of claim 1 wherein the second region does not include a hole extending through the plate.

18. The assembly of claim 1 wherein the second region comprises an arcuate surface configured to direct fluid flow 90° from a flow direction to the plate.

19. The assembly of claim 1 wherein the second region comprises:
   an arcuate surface configured to direct fluid flow 90° from a flow direction to the plate; and
   a flat surface connected with the arcuate surface which extends to the second passageway when in the first radial position.

20. A semiconductor processing reactive precursor valve assembly comprising:
   a valve body having at least one inlet and at least two outlets, the inlet being configured for connection with a reactive precursor source, a first of the outlets being configured for connection with a feed stream to a semiconductor substrate processor chamber, a second of the outlets being configured for diverting precursor flow away from said chamber;
   the valve body comprising a first fluid passageway therein extending between the inlet and the first outlet in a first straight axial line, the valve body comprising a second fluid passageway extending between the first fluid passageway and the second outlet in a second straight axial line which is perpendicular to the first straight axial line; and
   a circular control plate mounted for at least limited rotation within the body proximate the first and second passageways about an axis of rotation which is generally parallel with the first straight axial line, the plate including an arcuate region at least a portion of which is received within the first passageway, the arcuate region including a first region having an opening extending through the plate positionable into a first selected radial orientation to provide the inlet and the first outlet in fluid communication with one another through the first passageway while blocking substantially all fluid flow to the second passageway, the first region plate opening having a maximum cross section which is at least as large as that of the first passageway proximate the control plate, the arcuate region including a second region positionable into the first radial orientation to provide the inlet and the second outlet in fluid communication through the first and second passageway while blocking substantially all flow to the first outlet, the second region comprising an arcuate surface configured to direct fluid flow 90° from a flow direction to the plate, the second region comprising a flat surface connected with the arcuate surface which extends to the second passageway when in the first radial position.

21. The assembly of claim 20 wherein the control plate is mounted for 360° rotation within the body.

22. The assembly of claim 20 wherein the arcuate region is an annulus including a plurality of alternating of said first and second regions.

23. The assembly of claim 20 wherein, the control plate is mounted for 360° rotation within the body; and the arcuate region is an annulus including a plurality of alternating of said first and second regions.

24. The assembly of claim 23 comprising at least three of said first regions and at least three of said second regions.

25. A semiconductor processing reactive precursor valve assembly comprising:

a valve body having at least one inlet and at least two outlets, the inlet being configured for connection with a reactive precursor source, a first of the outlets being configured for connection with a feed stream to a semiconductor substrate processor chamber, a second of the outlets being configured for diverting precursor flow away from said chamber;

the valve body comprising a first fluid passageway therein extending between the inlet and the first outlet, the valve body comprising a second fluid passageway extending between the first fluid passageway and the second outlet; and a generally cylindrical mass mounted for at least limited rotation within the body proximate the first and second passageways, the mass including an arcuate region at least a portion of which is received within the first passageway, the arcuate region including a first region having an opening extending through the mass positionable into a first selected radial orientation to provide the inlet and the first outlet in fluid communication with one another through the first passageway while restricting flow to the second passageway, the arcuate region including a second region positionable into the first radial orientation to provide the inlet and second outlet in fluid communication through the first and second passageways while restricting flow to the first outlet.

26. The assembly of claim 25 wherein the generally cylindrical mass is mounted for 360° rotation within the body.

* * * * *

UNITED STATES PATENT AND TRADEMARK OFFICE
CERTIFICATE OF CORRECTION

| | | |
|---|---|---|
| PATENT NO. | : 7,000,636 B2 | Page 1 of 1 |
| APPLICATION NO. | : 10/691769 | |
| DATED | : February 21, 2006 | |
| INVENTOR(S) | : Dando et al. | |

It is certified that error appears in the above-identified patent and that said Letters Patent is hereby corrected as shown below:

Col. 1, line 60, please delete "process" after "such" and insert --processes--.

Col. 5, line 5, please delete "atomio" after "In one" and insert --atomic--.

Col. 5, line 43, please delete "staring" before "the diverting" and insert --starting--.

Col. 7, line 40, please delete "portion" after "second longitudinal" and insert --portion--.

Signed and Sealed this

Fifth Day of June, 2007

JON W. DUDAS
*Director of the United States Patent and Trademark Office*